(12) United States Patent
Hirata et al.

(10) Patent No.: US 9,841,770 B2
(45) Date of Patent: Dec. 12, 2017

(54) PRESSURE-TYPE FLOW CONTROL DEVICE AND METHOD FOR PREVENTING OVERSHOOTING AT START OF FLOW CONTROL PERFORMED BY SAID DEVICE

(71) Applicant: FUJIKIN INCORPORATED, Osaka (JP)

(72) Inventors: Kaoru Hirata, Osaka (JP); Nobukazu Ikeda, Osaka (JP); Kouji Nishino, Osaka (JP); Ryousuke Dohi, Osaka (JP); Katsuyuki Sugita, Osaka (JP); Masaaki Nagase, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 7 days.

(21) Appl. No.: 15/110,208

(22) PCT Filed: Jan. 15, 2015

(86) PCT No.: PCT/JP2015/000154
§ 371 (c)(1),
(2) Date: Jul. 7, 2016

(87) PCT Pub. No.: WO2015/111391
PCT Pub. Date: Jul. 30, 2015

(65) Prior Publication Data
US 2016/0327963 A1    Nov. 10, 2016

(30) Foreign Application Priority Data

Jan. 21, 2014  (JP) ................................. 2014-008831

(51) Int. Cl.
*F16K 31/02* (2006.01)
*G05D 7/06* (2006.01)
(Continued)

(52) U.S. Cl.
CPC ............. *G05D 7/0635* (2013.01); *F16K 7/14* (2013.01); *F16K 7/16* (2013.01); *F16K 31/004* (2013.01);
(Continued)

(58) Field of Classification Search
USPC ..................................... 73/861.52
See application file for complete search history.

(56) References Cited

U.S. PATENT DOCUMENTS 4,550,747 A * 11/1985 Woodworth ......... G05D 7/0635
137/487.5
5,739,429 A * 4/1998 Schmitkons ............. B05B 7/14
73/196

FOREIGN PATENT DOCUMENTS

JP  2000-213667 A  8/2000
JP  5430007 B2  2/2014

OTHER PUBLICATIONS

International Search Report dated in PCT/JP2015/000154; dated Apr. 21, 2015.

* cited by examiner

*Primary Examiner* — John Fox
(74) *Attorney, Agent, or Firm* — Studebaker & Brackett PC (57) ABSTRACT

The pressure-type flow control device includes: a main body provided with a fluid channel communicating between a fluid inlet and a fluid outlet and an exhaust channel communicating between the fluid channel and an exhaust outlet; a pressure control valve fixed to a fluid inlet side of the main body for opening or closing the upstream side of the fluid channel; a first pressure sensor for detecting the internal pressure of the fluid channel on the downstream side of the control valve; an orifice provided in the fluid channel on the downstream side of the point of branching of the exhaust
(Continued)

channel; an on/off valve for opening or closing the fluid channel on the downstream side of the first pressure sensor; and an exhaust valve for opening or closing the exhaust channel.

13 Claims, 7 Drawing Sheets (51) Int. Cl.
*F16K 7/14* (2006.01)
*F16K 31/06* (2006.01)
*F16K 31/12* (2006.01)
*H01L 21/67* (2006.01)
*F16K 7/16* (2006.01)
*F16K 31/00* (2006.01)

(52) U.S. Cl.
CPC .............. *F16K 31/02* (2013.01); *F16K 31/06* (2013.01); *F16K 31/12* (2013.01); *G05D 7/0641* (2013.01); *H01L 21/67253* (2013.01)

PRESSURE-TYPE FLOW CONTROL DEVICE AND METHOD FOR PREVENTING OVERSHOOTING AT START OF FLOW CONTROL PERFORMED BY SAID DEVICE

TECHNICAL FIELD

The present invention relates to the improvement of a pressure-type flow control device. The present invention relates to a pressure-type flow control device having improved compliance of flow control and enhanced responsiveness at the time of flow step-up or flow step-down, thereby allowing for significant enhancement of the operation performance of a source gas supply device for a semiconductor manufacturing device, etc., and also to a method for preventing overshooting at the start of flow control thereby.

BACKGROUND ART

Figure 5:
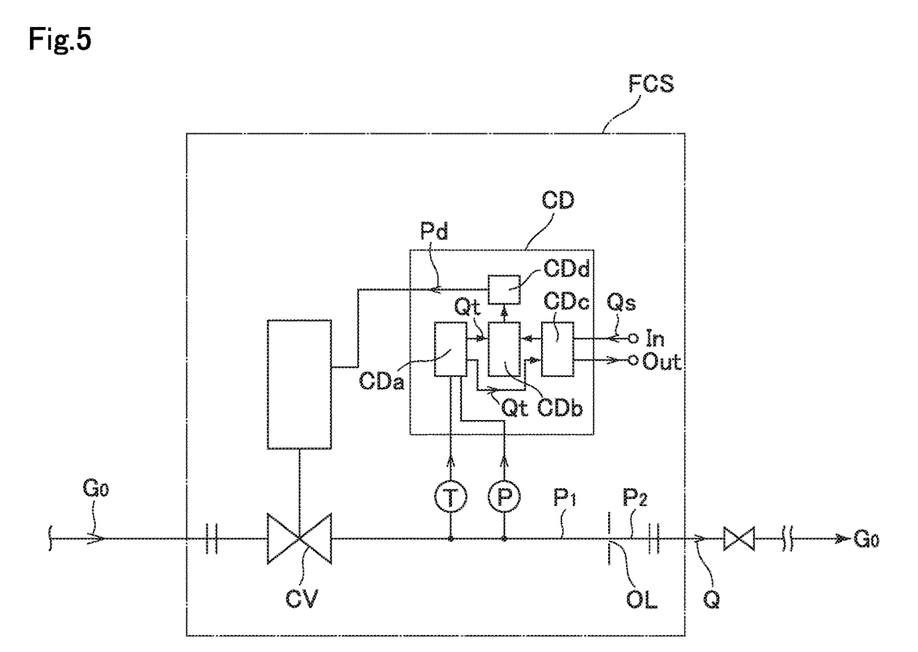
FIG. 5 A basic configuration diagram of a conventional pressure-type flow control device (FCS-N type).

Conventionally, in source gas supply devices for semiconductor manufacturing devices, etc., heat-type flow control devices and pressure-type flow control devices have been widely used for controlling the supplied gas flow. In particular, the latter pressure-type flow control device FCS is, as shown in FIG. 5, composed of a control valve CV, a temperature detector T, a pressure detector P, an orifice OL, a computation control unit CD, and the like. Such a flow control device has the excellent flow characteristic that stable flow control can be achieved even when the primary-side supply pressure is significantly changed.

That is, in the pressure-type flow control device FCS of FIG. 5, the computation control unit CD is composed of a temperature correction/flow computation circuit CDa, a comparison circuit CDb, an input/output circuit CDc, an output circuit CDd, and the like. Then, values detected at the pressure detector P and the temperature detector T are input to the temperature correction/flow computation circuit CDa, where the detected pressure is subjected to temperature correction and flow computation, and then the flow computation value Qt is input to the comparison circuit CDb.

In addition, an input signal Qs corresponding to the set flow is input from the terminal In and then input to the comparison circuit CDb through the input/output circuit CDc, where the signal is compared with the flow computation value Qt from the temperature correction/flow computation circuit CDa described above. When the comparison shows a difference between the set flow input signal Qs and the flow computation value Qt, a control signal Pd is output to the actuator of the control valve CV. Accordingly, the control valve CV is actuated, and automatic regulation is performed to make the difference between the set flow input signal Qs and the computed flow value Qt (Qs−Qt) become zero.

In the pressure-type flow control device FCS described above, when a so-called critical expansion condition of $P_1/P_2 \geq$ about 2 is maintained between the pressure $P_2$ on the downstream side and the pressure $P_1$ on the upstream side of the orifice OL, the gas flow Q through the orifice OL is represented by $Q=KP_1$ (wherein K is a constant). Meanwhile, when the critical expansion condition is not satisfied, the gas flow Q through the orifice OL is calculated as $Q=KP_2^m(P_1-P_2)^n$ (wherein K, m, and n are constants).

This makes it possible to exert the excellent characteristics that the flow Q can be controlled with high accuracy by controlling the pressure $P_1$, and further, even when there is a significant change in the pressure of the gas Go on the upstream side of the control valve CV, the controlled flow value hardly changes.

The pressure-type flow control device designed such that the gas flow Q is computed as $Q=KP_1$ (wherein K is a constant) as described above is generally called FCS-N type. In addition, the pressure-type flow control device designed such that the gas flow Q is computed as $Q=KP_2^m(P_1-P_2)^n$ (wherein K, m, and n are constants) is called FCS-WR type.

As pressure-type flow control devices of this kind, other types exist, including those in which an orifice of the above FCS-N type is configured as a plurality of orifices OL connected in parallel, and they are arbitrarily selected by a switching valve to allow the flow control range to be changed (FCS-SN type), and those in which the same orifice mechanism is used as an orifice of the above FCS-WR type (FCS-SWR type).

Figure 6:
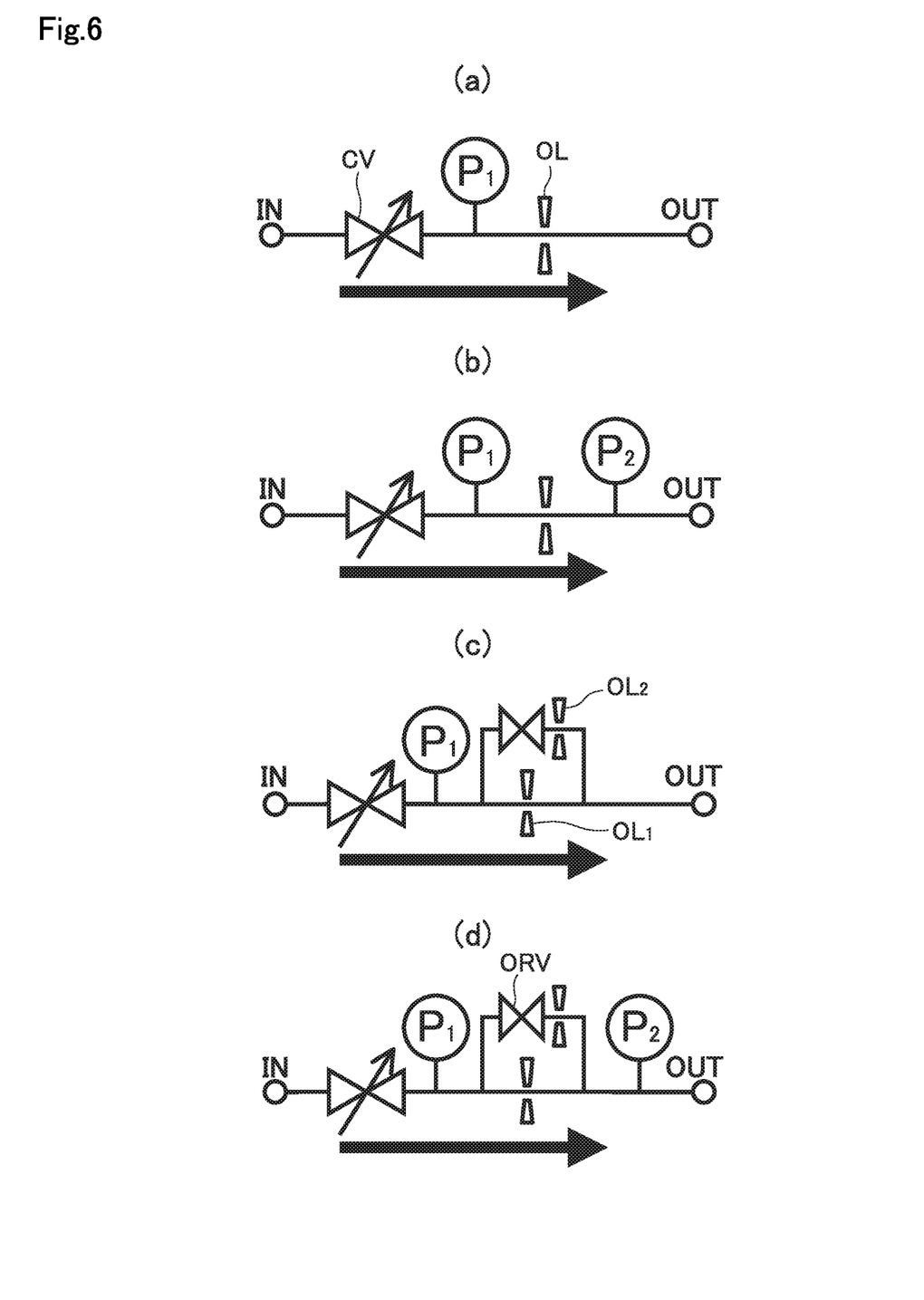
FIG. 6 Schematic configuration diagrams of conventional pressure-type flow control devices of various types: (a) shows FCS-N type, (b) shows a pressure-type flow control device (FCS-WR type), (c) shows FCS-SN type, and (d) shows FCS-SWR type.

FIG. 6 shows configuration system diagrams of the above FCS-N type (JP-A-8-338546, etc.), FCS-SN type (JP-A-2006-330851, etc.), FCS-WR type (JP-A-2003-195948, etc.), and FCS-SWR type (Patent Application No. 2010-512916, etc.). Their configurations, operation principles, and the like are already known, and thus the detailed description thereof will be omitted herein.

In FIG. 6, reference signs $P_1$ and $P_2$ denote pressure sensors, a reference sign CV denotes a control valve, a reference sign OL denotes an orifice, a reference sign $OL_1$ denotes a small-diameter orifice, a reference sign $OL_2$ denotes a large-diameter orifice, and a reference sign ORV denotes an orifice switching valve.

When the source gas is supplied, it is possible to supply a predetermined amount of source gas using a pressure-type flow control device FCS of this kind. However, in order to supply the source gas more precisely, it has been demanded to perform so-called pulse control with improved flow step-up and step-down characteristics.

Figure 7:
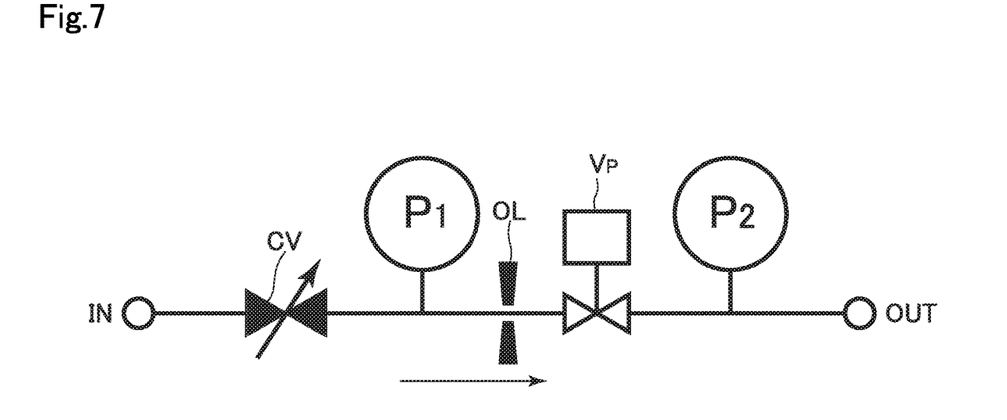
FIG. 7 A system configuration diagram of a conventional pressure-type flow control device (FCS-N type) to which pulse flow control by an on/off valve is applied.

FIG. 7 is a configuration system diagram of a pressure-type flow control device capable of such pulse control, in which the internal volume between an orifice OL and an on/off valve Vp is minimized to offer excellent step-up and step-down characteristics, making it possible to perform pulse control with high accuracy.

However, in a conventional pressure-type flow control device in which an on/off valve is provided on the orifice downstream side and pulse flow control is achieved by controlling the valve to open or close, the internal pressure of the fluid channel may increase due to minute leakage of the source gas from the control valve while the control valve CV is closed to stop the flow control. This results in a problem in that when the flow control is re-started, due to the increased internal pressure of the fluid channel, the controlled flow value "overshoots" at the time of step-up.

CITATION LIST

Patent Literature

Patent Literature 1: JP-A-8-338546
Patent Literature 2: JP-A-10-55218
Patent Literature 3: JP-A-2003-195948
Patent Literature 4: JP-A-2006-330851
Patent Literature 5: Japanese Patent Application No. 2010-512916
Patent Literature 6: JP-A-2000-213667

SUMMARY OF INVENTION

Technical Problem

A main object of the present invention is to provide a pressure-type flow control device capable of pulse flow control and also a method for preventing overshoot at the start of flow control thereby. That is, in a conventional pressure-type flow control device, when an on/off valve is provided on the orifice downstream side, pulse flow control can be achieved by controlling the valve to open or close. However, the internal pressure of the fluid channel increases due to minute leakage of the source gas from the control valve when flow control is not performed. Accordingly, the internal pressure of the fluid channel at the start of flow control becomes higher than the set value, resulting in overshoot.

The present invention is aimed at solving the problem of overshoot at the start of flow control described above. A main object of the present invention is to provide a pressure-type flow control device capable of pulse flow control and also a method for preventing overshoot at the start of flow control thereby.

Solution to Problem

According to the present invention, in a pressure-type flow control device including a conventional pressure-type flow control device, wherein an on/off valve is provided on the orifice downstream, and pulse flow control can be performed by controlling the on/off valve to open or close, in order to solve the problem that overshoot occurs at the start of flow control described above, a vent line is provided on the orifice upstream side, and gas is previously evacuated through an exhaust channel before the start of flow control to reduce the pressure on the orifice downstream side, thereby preventing overshoot at the start of flow control.

That is, the pressure-type flow control device according to the present invention is basically configured to include: a main body provided with a fluid channel communicating between a fluid inlet and a fluid outlet and an exhaust channel branched from the fluid channel and communicating between the fluid channel and an exhaust outlet; a pressure control valve fixed to the fluid inlet side of the main body for opening or closing the upstream side of the fluid channel; a first pressure sensor for detecting the internal pressure of the fluid channel on the downstream side of the pressure control valve; an orifice provided in the fluid channel on the downstream side of the point of branching of the exhaust channel; an on/off valve for opening or closing the fluid channel on the downstream side of the first pressure sensor; and an exhaust valve for opening or closing the exhaust channel. Before the start of fluid flow control by the pressure-type flow control device, the pressure control valve and the exhaust valve are operated to forcibly exhaust gas in the fluid channel space between the pressure control valve and the on/off valve, whereby overshoot at the start of flow control can be prevented.

At the time of flow control, the flow can be pulse-controlled by opening or closing the on/off valve.

The on/off valve may be provided on the downstream side of the orifice.

The exhaust valve may be a control valve.

The main body may be provided with a second pressure sensor for detecting the internal pressure of the fluid channel on the orifice downstream side.

The second pressure sensor may be a sensor for detecting the internal pressure of the fluid channel between the orifice and the on/off valve.

The orifice and the on/off valve may constitute an orifice-built-in valve having the orifice and on/off valve integrally assembled and fixed.

The configuration may be such that a plurality of the orifices are connected in parallel, and a fluid is allowed to flow through at least one orifice by a switching valve.

The configuration may be such that a plurality of the orifices are connected in parallel, and a fluid is allowed to flow through at least one orifice by a switching valve, and also the flow control device may include a pressure sensor for detecting the internal pressure of the fluid channel on the orifice downstream side.

The pressure control valve and the exhaust valve may each be a metal-diaphragm control valve actuated by a piezoelectric element.

The on/off valve may be a pneumatically actuated valve or an electromagnetically actuated valve.

The gas in the exhaust channel may be forcibly exhausted by a vacuum pump connected to the exhaust outlet.

In addition, the method according to the invention is a method for preventing overshoot in a pressure-type flow control device including a main body provided with a fluid channel communicating between a fluid inlet and a fluid outlet and an exhaust channel branched from the fluid channel and communicating between the fluid channel and an exhaust outlet, a pressure control valve fixed to the fluid inlet side of the main body for opening or closing the upstream side of the fluid channel, a first pressure sensor for detecting the internal pressure of the fluid channel on the downstream side of the pressure control valve, an orifice provided in the fluid channel on the downstream side of the point of branching of the exhaust channel, an on/off valve for opening or closing the fluid channel on the downstream side of the orifice, and an exhaust valve for opening or closing the exhaust channel, the method including a step of, before the start of flow control by the pressure-type flow control device, operating the exhaust valve to forcibly exhaust gas in the fluid channel space between the pressure control valve and the orifice, thereby preventing overshoot at the start of flow control.

Advantageous Effects of Invention

In the present invention, the pressure-type flow control device includes: a main body provided with a fluid channel communicating between a fluid inlet and a fluid outlet and an exhaust channel communicating between the fluid channel and an exhaust outlet; a pressure control valve fixed to the fluid inlet side of the main body for opening or closing the upstream side of the fluid channel; a first pressure sensor for detecting the internal pressure of the fluid channel on the downstream side of the pressure control valve; an orifice provided in the fluid channel on the downstream side of the point of branching of the exhaust channel; an on/off valve for opening or closing the fluid channel on the downstream side of the first pressure sensor; and an exhaust valve for opening or closing the exhaust channel. Before the start of fluid flow control by the pressure-type flow control device, the pressure control valve and the exhaust valve are operated to forcibly exhaust gas in the fluid channel space between the pressure control valve and the on/off valve, whereby overshoot at the start of flow control can be prevented.

As a result, in the pressure-type flow control device according to the present invention, the control responsiveness to changes in the flow is enhanced, whereby the step-up time and step-down time in flow control can be significantly shortened, and also the time regulation is facilitated, making it possible to improve the so-called gas replaceability of the pressure-type flow control device, leading to improvement in the capacity utilization, improvement in the quality of semiconductor products, and the like.

Further, when the on/off valve to be provided in a fluid supply channel is an orifice-built-in on/off valve, the pressure-type flow control device can be further downsized. At the same time, when the exhaust valve is closed, such a flow control device can also be applied as an ordinary pressure-type flow control device.

In addition, when the fluid flow is subjected to so-called pulse flow control using the on/off valve provided in the fluid channel, the compliance of control is significantly improved because the internal pressure of the fluid channel on the orifice upstream side is reduced.

DESCRIPTION OF EMBODIMENTS

Hereinafter, embodiments of the present invention will be described based on the drawings.

Figure 1:
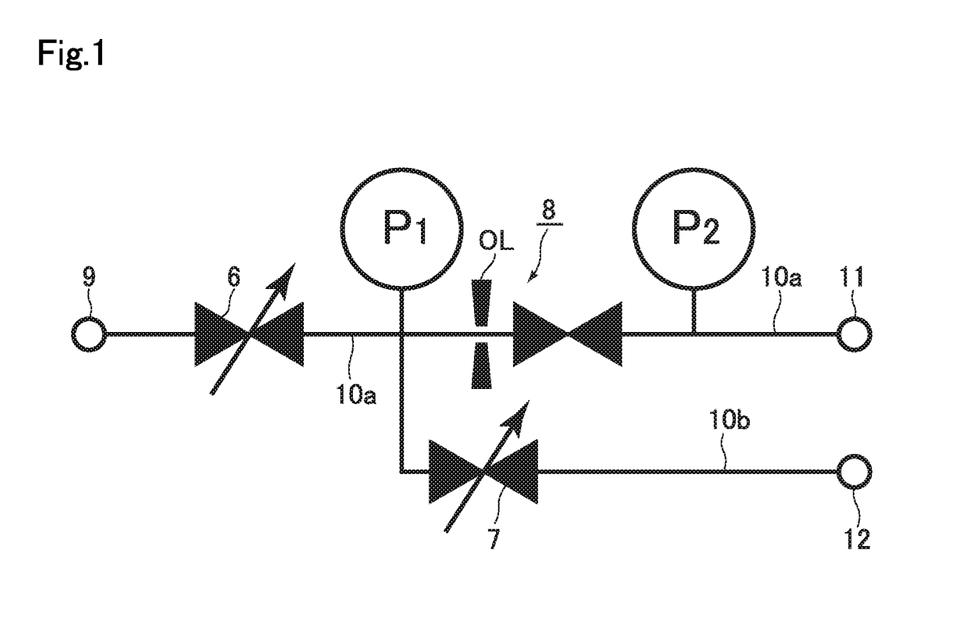
FIG. 1 A system diagram showing the basic configuration of the pressure-type flow control device according to the present invention.
Figure 2:
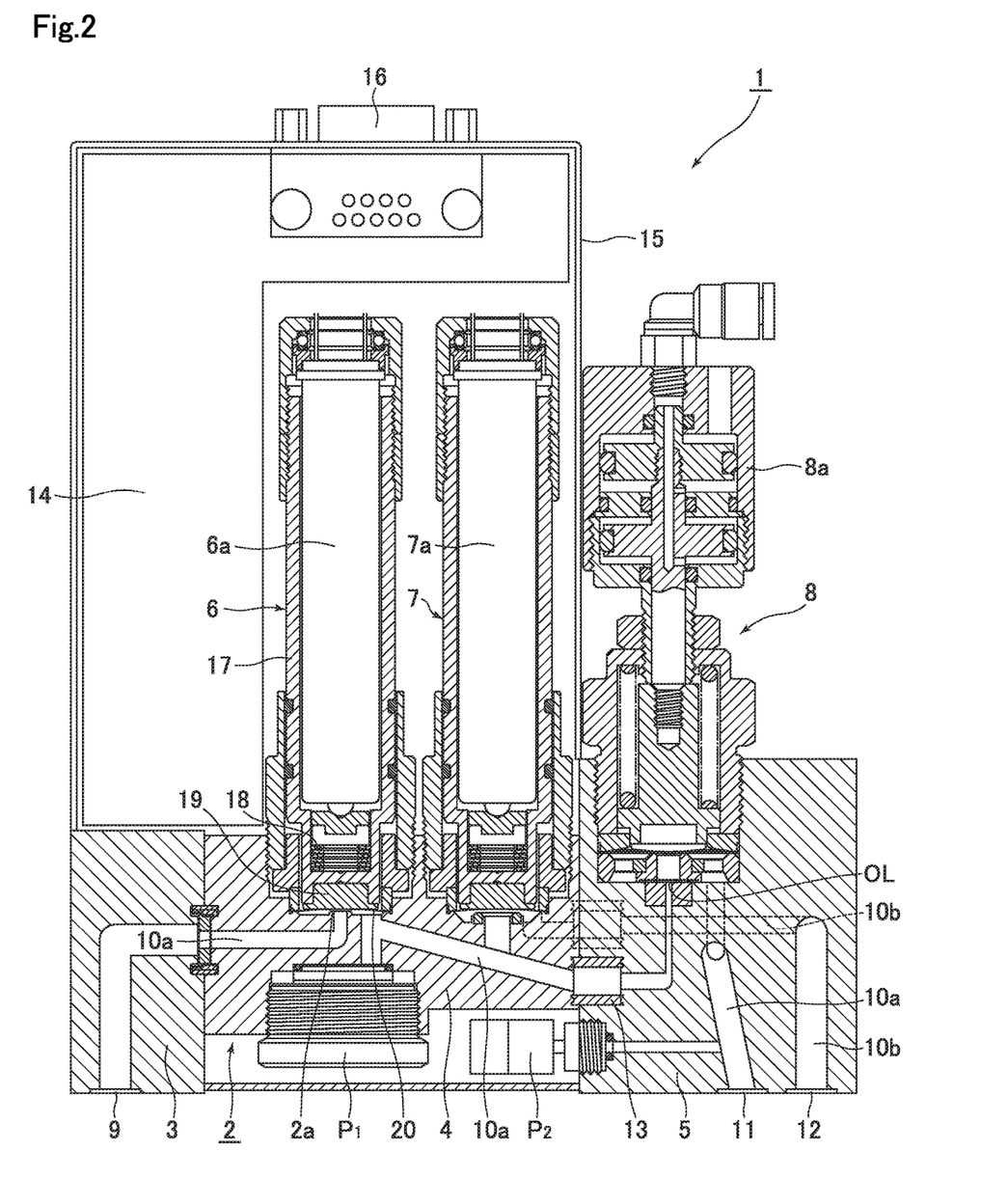
FIG. 2 A longitudinal cross-sectional view showing the basic configuration of the pressure-type flow control device according to the present invention.
Figure 3:
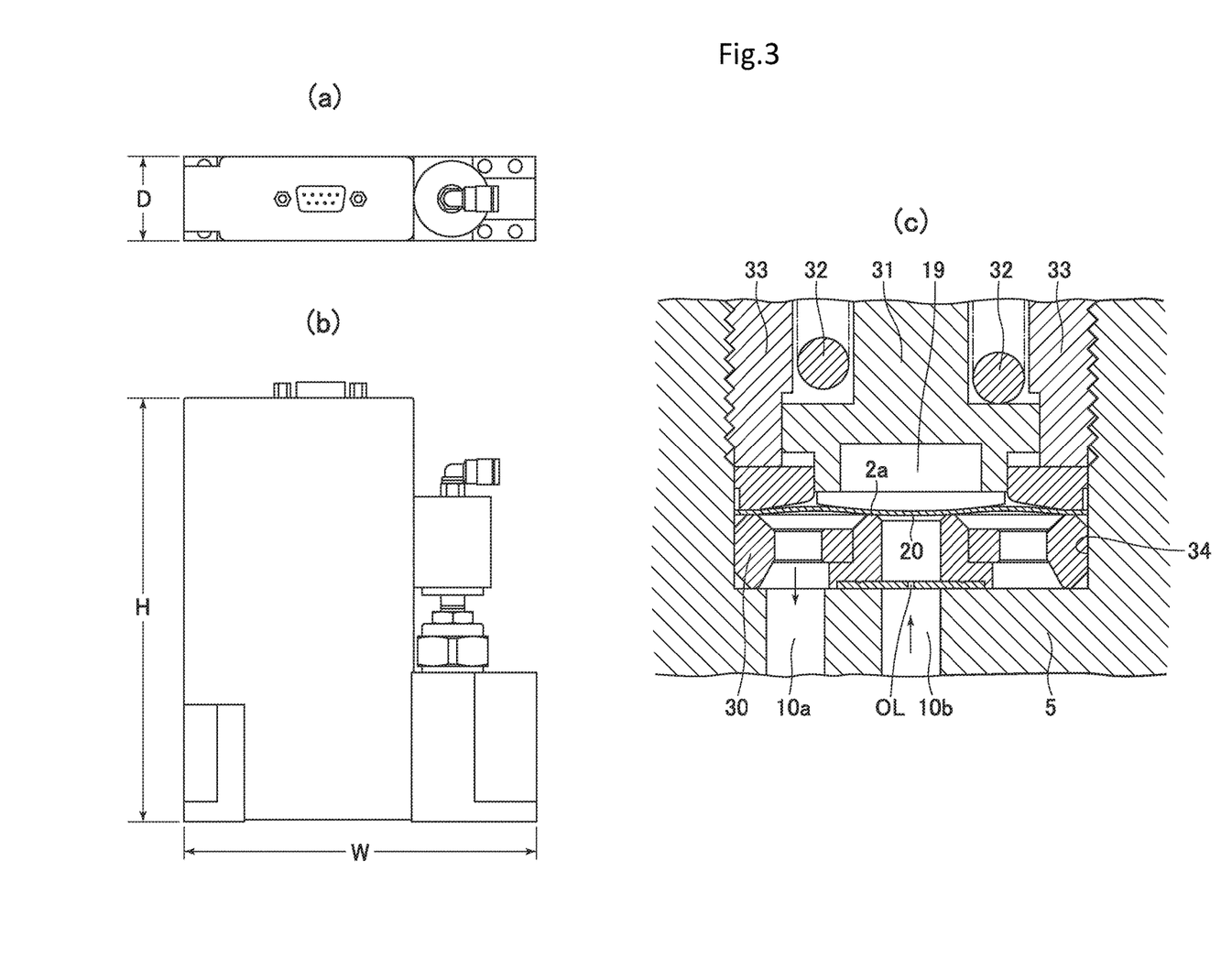
FIG. 3 A plan view (a) and a front view (b) of the pressure-type flow control device according to the present invention, and a partial enlarged cross-sectional view (c) of an orifice-built-in on/off valve.

FIG. 1 is a system diagram showing the basic configuration of the pressure-type flow control device according to the present invention, FIG. 2 is longitudinal cross-sectional view showing the basic configuration of the pressure-type flow control device according to the present invention, and FIG. 3 shows a plan view (a) and a front view (b) of the pressure-type flow control device according to the present invention, as well as a partial enlarged cross-sectional view (c) of an orifice-built-in on/off valve.

Figure 4:
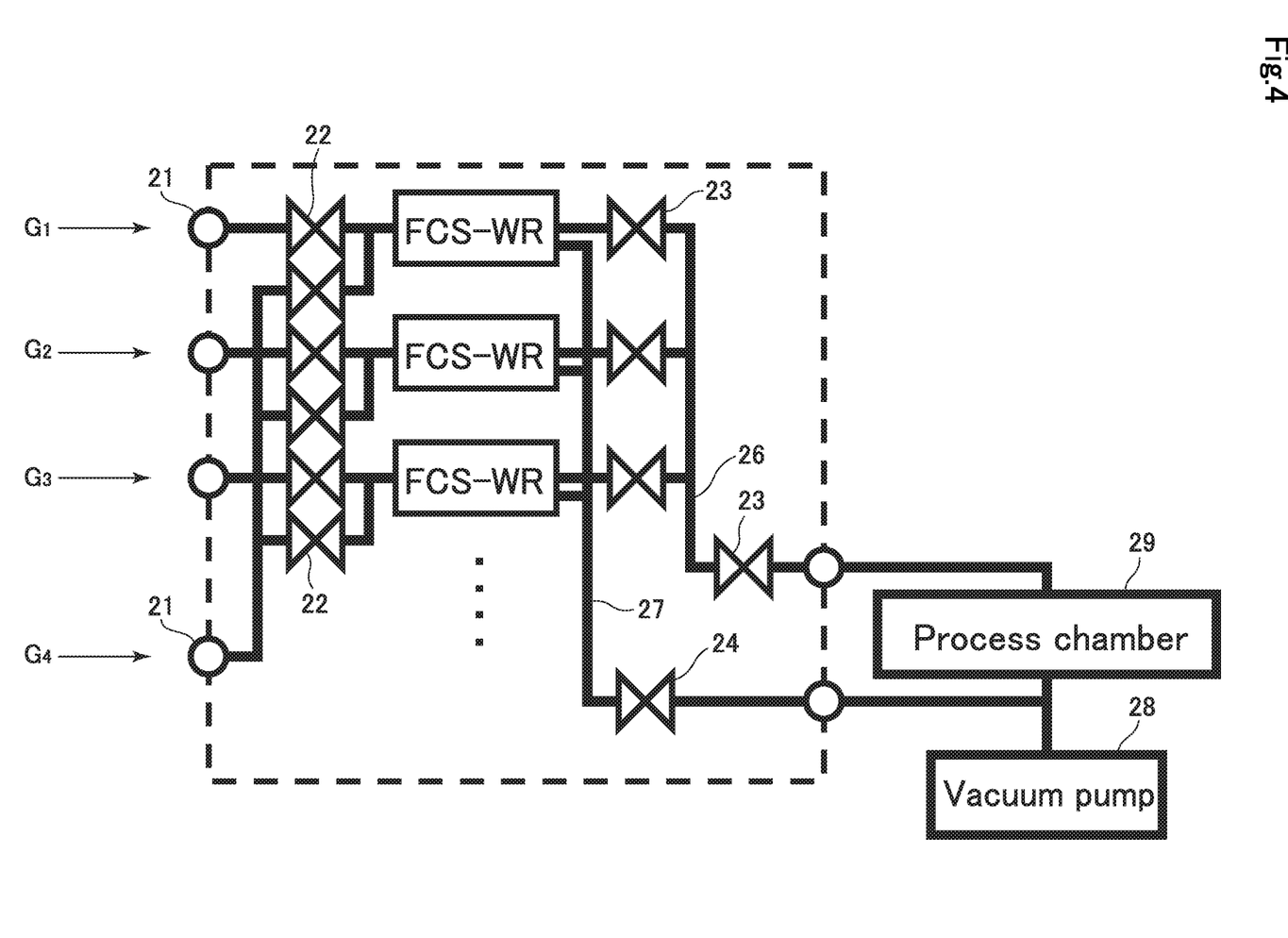
FIG. 4 A system diagram showing the configuration of a gas supply box having the pressure-type flow control device according to the present invention applied thereto.

In addition, FIG. 4 is a system diagram showing the configuration of a gas supply box using the pressure-type flow control device according to the present invention.

With reference to FIG. 1 to FIG. 3, the pressure-type flow control device 1 according to the present invention comprises a main body 2, a pressure control valve 6, an exhaust valve 7, a pneumatically actuated on/off valve 8, a first pressure sensor $P_1$, a second pressure sensor $P_2$, an orifice OL, and the like. In addition, the embodiment shown in FIG. 2 is a pressure-type flow control device of FCS-WR type using one orifice OL, a first pressure sensor $P_1$, a second pressure sensor $P_2$, and a pneumatically actuated on/off valve 8, which is configured such that no matter whether the fluid flowing through the flow orifice OL is under critical conditions or non-critical conditions, flow control is possible by pressure regulation by the pressure control valve 6.

In FIG. 1 to FIG. 3, a reference sign 2a denotes a valve seat, a reference sign 3 denotes an inlet-side block, a reference sign 4 denotes a main body block, a reference sign 5 denotes an outlet-side block, a reference sign 8 denotes a pneumatically actuated on/off valve, a reference sign 8a denotes a pneumatic valve actuator, a reference sign 9 denotes a fluid inlet, a reference sign 10a denotes a fluid channel, a reference sign 10b denotes an exhaust channel, a reference sign 11 denotes a fluid outlet, a reference sign 12 denotes an exhaust outlet, a reference sign 13 denotes a gasket, a reference sign 14 denotes a panel control board for control, a reference sign 15 denotes a casing, and a reference sign 16 denotes a connector for connection.

The main body 2 has the inlet-side block 3, the main body block 4, and the outlet-side block 5 assembled together and integrated by a securing bolt (not illustrated). The pressure control valve 6, the exhaust valve 7, the first pressure sensor $P_1$, the second pressure sensor $P_2$, and the like are each screw-fixed to the main body 2. In addition, the second pressure sensor $P_2$ is placed at a lower part of the internal surface of the outlet-side block 5 and communicated to the fluid channel 10a avoiding intersection with the exhaust channel 10b.

The pressure control valve 6 is a valve that is opened or closed by using a piezoelectric actuation element 6a, in which a known metal diaphragm serves as a valve element 20. When energized, the piezoelectric actuation element 6a expands to push a cylindrical body 17 upward against the elasticity of an elastic body 18. As a result, the valve element presser 19 is moved upward, and, due to the elastic force of the metal diaphragm valve element 20, the valve element 20 comes off the valve seat 2a to open the valve. In addition, the degree of valve opening is adjusted by changing the voltage applied to the piezoelectric actuation element 6a.

In addition, the structure and operation of the exhaust valve 7 may be the same as of the pressure control valve 6, and the degree of valve opening can be controlled by adjusting the elongation amount of a piezoelectric actuation element 7a.

As the exhaust valve 7, in place of the piezoelectrically actuated metal-diaphragm valve described above, it is also possible to use a known pneumatically actuated or electromagnetically actuated on/off control valve. It is possible to use an on/off valve instead of a control valve.

Further, similarly to conventional pressure-type flow control devices of this kind, the operation control of the pressure control valve 6, the exhaust valve 7, the on/off valve 8, and the like can all be performed automatically through the panel control board 14.

In the pressure-type flow control device of FCS-WR type shown in the FIG. 2, in order to downsize the device and reduce the fluid channel volume, an orifice-built-in on/off valve, which is formed of the orifice OL and the on/off valve 8 integrally assembled, is used. The structure of such an orifice-built-in on/off valve 8 itself is known (Patent Literature 6, JP-A-2000-213667, etc.), and thus the detailed description thereof is omitted herein. However, as shown in FIG. 3(c), the configuration is as follows: a hole 34 for receiving a valve mechanism is provided in the upper surface of an outlet-side block 5, with the components of the valve mechanism such as an orifice OL, a valve seat ring 30, a valve element (metal diaphragm) 20, a pressing cylindrical body 33, a valve element presser 19, a stem 31, a spring 32, and the like being placed therein, and an on/off valve 8 is fixed onto the outlet-side block 5 forming the main body 2.

By using an orifice-built-in on/off valve, the internal volume between the orifice and the valve element can be minimized, whereby the flow step-up characteristics and step-down characteristics at the time of opening or closing the valve are improved.

With respect to the orifice-built-in on/off valve, the orifice is provided on the upstream side, while the valve element is provided on the downstream side; in this case, the step-down characteristics affected only by the operation of the on/off valve, and, because the internal volume is extremely small, the step-up characteristics are hardly affected by the internal volume. When the attachment direction of the orifice-built-in on/off valve reversed, the valve element is provided on the upstream side, while the orifice is provided on the downstream side; in this case, the step-up characteristics are affected only by the operation of the on/off valve, and the step-down characteristics are hardly affected by the internal volume.

FIG. 4 is a system diagram showing the configuration of a gas supply box using the pressure-type flow control device according to the present invention. Three kinds of live gas $G_1$ to $G_3$ and $G_2$ gas are each independently, or alternatively as a mixture of suitable gas kinds in a predetermined ratio, supplied to a process chamber 29. As described above, through the exhaust valve 7 (not illustrated), gas in the internal space of FCS-N is forcibly exhausted (evacuated) by a vacuum pump 28 through an outlet-side on/off valve 24 of an exhaust line 27.

In FIG. 4, a reference sign 21 denotes a gas supply port, a reference sign 22 denotes a supply-side switching valve, a reference sign 23 denotes an outlet-side switching valve, and a reference sign 26 denotes a mixed gas supply line.

The embodiments of FIG. 1 to FIG. 3 have been described based on a pressure-type flow control device of FCS-N type using the orifice-built-in on/off valve 8 shown in FIG. 3 (C). However, needless to say, the pressure-type flow control device may be FCS-N type, FCS-SN type, or FCS-SWR type, and the conventional pressure-type flow control device of any type shown in FIG. 5 is applicable for the implementation of the present invention.

In addition, in the case where pulse flow control is performed in the pressure-type flow control device according to the present invention, high-accuracy pulse flow control can be performed with pulse intervals of several tens to hundreds of microseconds.

Note that the operation principles and configurations of pressure-type flow control devices are already known, and thus the detailed description thereof is omitted herein.

INDUSTRIAL APPLICABILITY

The present invention can be applied to flow control devices not only for gas supply facilities or gas supply devices for semiconductor manufacturing devices, but also for any gas supply facilities in the chemical industry, the food industry, and the like.

REFERENCE SIGNS LIST

1: Pressure-type flow control device
2: Main body
2a: Valve seat
3: Inlet-side block
4: Main body block
5: Outlet-side block
6: Pressure control valve
6a: Piezoelectric actuation element
7: Exhaust valve
7a: Piezoelectric actuation element
8: Pneumatically actuated on/off valve
8a: Pneumatic valve actuator
9: Fluid inlet
10a: Fluid channel
10b: Exhaust channel
10c: Channel for leak detection
11: Fluid outlet
12: Exhaust outlet
13: Gasket
14: Panel control board
15: Casing
16: Connector for connection
17: Cylindrical body
18: Elastic body
19: Valve element presser
20: Valve element
21: Gas supply port
22: Supply-side switching valve
23: Outlet-side on/off valve
24: Outlet-side on/off valve
26: Mixed gas supply line
27: Evacuation line
28: Vacuum pump
29: Process chamber
30: Valve seat ring
31: Stem
32: Spring
33: Pressing cylindrical body
34: Hole
$P_1$: First pressure sensor
$P_2$: Second pressure sensor
OL: Orifice
$G_1$ to $G_3$: Live gas

The invention claimed is:

1. A pressure-type flow control device, comprising:
a main body provided with a fluid channel communicating between a fluid inlet and a fluid outlet and an exhaust channel branched from the fluid channel and communicating between the fluid channel and an exhaust outlet;
a pressure control valve fixed to a fluid inlet side of the main body for opening or closing the upstream side of the fluid channel;
a first pressure sensor for detecting the internal pressure of the fluid channel on the downstream side of the pressure control valve;
an orifice provided in the fluid channel on the downstream side of the point of branching of the exhaust channel;
an on/off valve for opening or closing the fluid channel on the downstream side of the first pressure sensor; and
an exhaust valve for opening or closing the exhaust channel.

2. The pressure-type flow control device according to claim 1, wherein at the time of flow control, the on/off valve is opened or closed to perform pulse flow control.

3. The pressure-type flow control device according to claim 1, wherein the on/off valve is provided on the downstream side of the orifice.

4. The pressure-type flow control device according to claim 1, wherein the main body is provided with a second pressure sensor for detecting the internal pressure of the fluid channel on the orifice downstream side.

5. The pressure-type flow control device according to claim 1, wherein the exhaust valve is a control valve.

6. The pressure-type flow control device according to claim 4, wherein the second pressure sensor is a sensor for detecting the internal pressure of the fluid channel on the downstream side of the on/off valve.

7. The pressure-type flow control device according to claim 1, wherein the orifice and the on/off valve constitute an orifice-built-in valve having the orifice and on/off valve integrally assembled and fixed.

8. The pressure-type flow control device according to claim 1, configured such that a plurality of orifices are connected in parallel, and a fluid is allowed to flow through at least one orifice by a switching valve.

9. The pressure-type flow control device according to claim 1, configured such that a plurality of orifices are connected in parallel, and a fluid is allowed to flow through at least one orifice by a switching valve, and also comprising a pressure sensor for detecting the internal pressure of the fluid channel on the orifice downstream side.

10. The pressure-type flow control device according to claim 1, wherein the pressure control valve is a metal-diaphragm control valve actuated by a piezoelectric element.

11. The pressure-type flow control device according to claim 1, wherein the on/off valve is a pneumatically actuated valve or an electromagnetically actuated valve.

12. The pressure-type flow control device according to claim 1, configured such that gas in the exhaust channel is forcibly exhausted by a vacuum pump connected to the exhaust outlet.

13. A method for preventing overshoot in a pressure-type flow control device including a main body provided with a fluid channel communicating between a fluid inlet and a fluid outlet and an exhaust channel branched from the fluid channel and communicating between the fluid channel and an exhaust outlet, a pressure control valve fixed to a fluid inlet side of the main body for opening or closing the upstream side of the fluid channel, a first pressure sensor for detecting the internal pressure of the fluid channel on the downstream side of the pressure control valve, an orifice provided in the fluid channel on the downstream side of the point of branching of the exhaust channel, an on/off valve for opening or closing the fluid channel on the downstream side of the first pressure sensor, and an exhaust valve for opening or closing the exhaust channel, the method including a step of, before the start of flow control by the pressure-type flow control device, operating the exhaust valve to forcibly exhaust gas in a fluid channel space between the pressure control valve and the on/off valve, thereby preventing overshoot at the start of flow control.

* * * * *